United States Patent [19]

Ports et al.

[11] 4,409,686
[45] Oct. 11, 1983

[54] METHOD OF SERIALIZATION OF DICE

[75] Inventors: Kenneth A. Ports, Indialantic; Justin E. Harlow, Melbourne, both of Fla.

[73] Assignee: Harris Corporation, Melbourne, Fla.

[21] Appl. No.: 159,750

[22] Filed: Jun. 16, 1980

[51] Int. Cl.³ .................... G06F 15/46; G06K 9/00
[52] U.S. Cl. .................................. 382/8; 364/491; 250/492.1
[58] Field of Search .............. 354/5, 7, 12, 105–109; 355/5–7, 13, 20, 40, 54; 340/146.3 F, 146.3 A, 146.3 H; 364/488–491; 250/492.1, 492.2, 492.3; 29/569 R, 569 L, 571, 574, 576 R, 576 B, 577 R, 577 C, 584; 382/1, 8, 9

[56] References Cited

U.S. PATENT DOCUMENTS

| | | | |
|---|---|---|---|
| 3,673,932 | 7/1972 | Rottmiller | 354/109 |
| 3,838,435 | 9/1974 | Mepham et al. | 354/109 |
| 4,011,570 | 3/1977 | Stievenart et al. | 354/109 |
| 4,040,723 | 8/1977 | Groeneweg | 354/109 |
| 4,093,990 | 6/1978 | Koller et al. | 364/491 |
| 4,259,724 | 3/1981 | Sugiyama | 364/491 |

OTHER PUBLICATIONS

Davis et al., "Automatic Registration in an Electron-Beam Lithographic System", *Solid State Technology*, Aug. 1978, pp. 61–67.

*Primary Examiner*—Leo H. Boudreau
*Attorney, Agent, or Firm*—Leitner, Palan, Martin & Bernstein

[57] ABSTRACT

The dice of a wafer are serialized using a wafer mask formed by stepping and repeating a chip pattern with a blank area in rows and columns on the wafer and forming distinctive location identifying indicia in the blank area on each chip using a pattern generator and stepping to each blank area on each chip.

8 Claims, 4 Drawing Figures

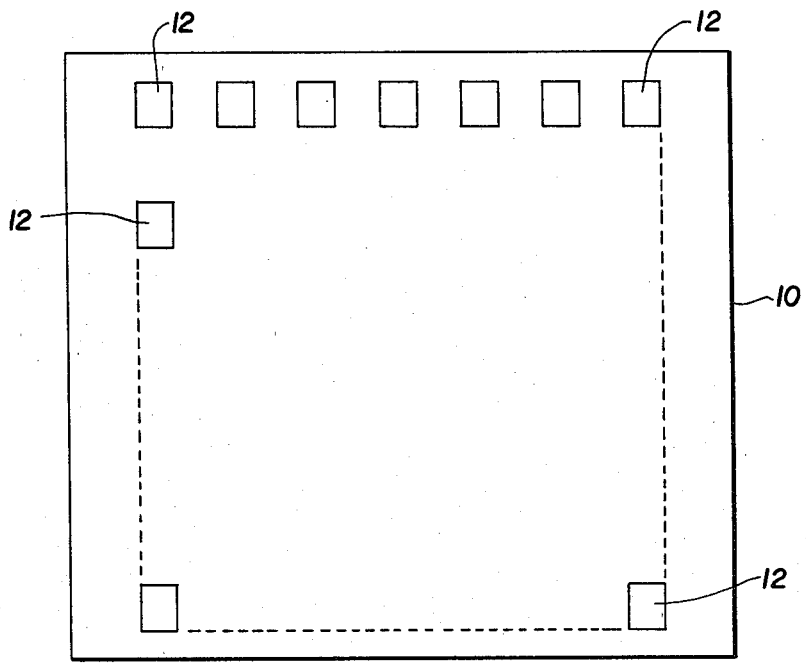
FIG.1
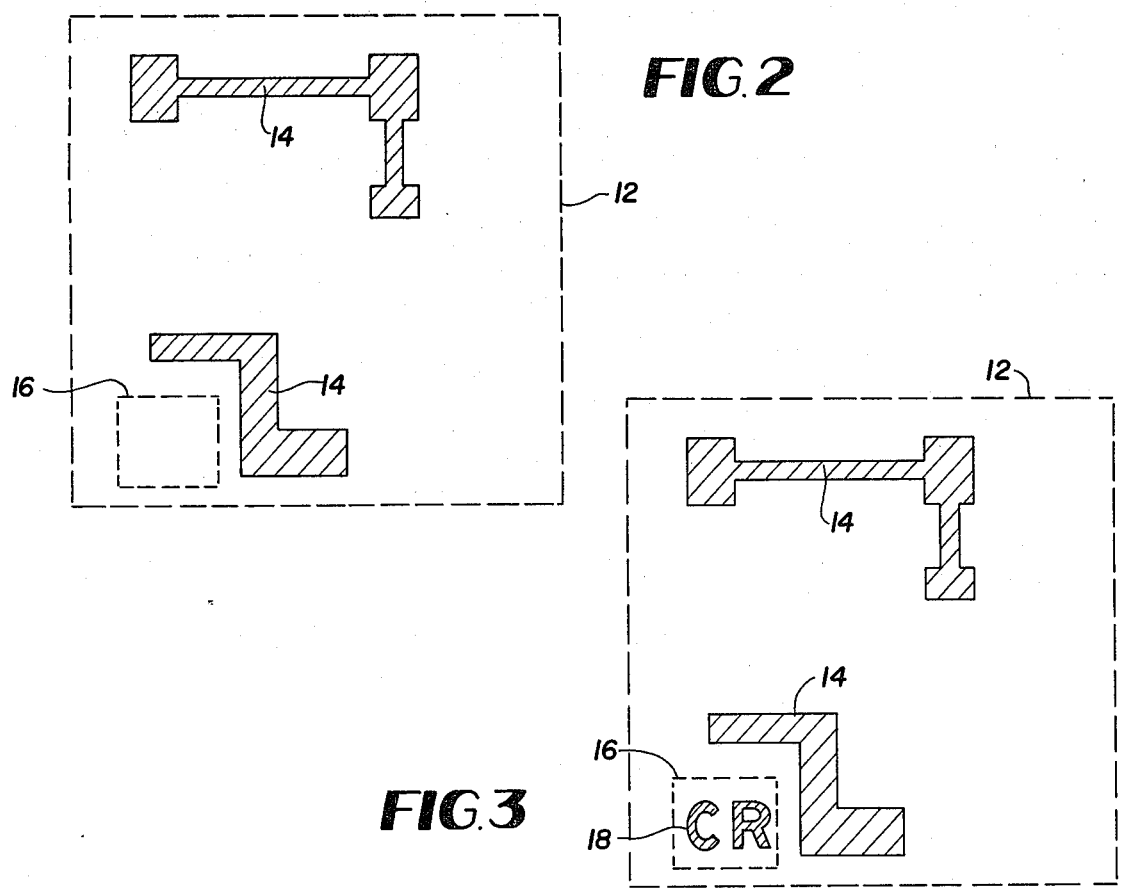
FIG.2
FIG.3

METHOD OF SERIALIZATION OF DICE

BACKGROUND OF THE INVENTION

The present invention relates generally to dice location identification on a wafer, and more specifically, to a method of forming the location indicia on the dice on a wafer.

It is often desirable to identify the area of a wafer from which a particular die has come. Some military contracts even require wafer quadrant identification to be maintained throughout the assembly and lot qualification procedure. The importance of identifying the failed or defective dice relative to their location on a wafer aids in the analysis of the processing steps and correction thereto. For example, the malfunction or failure of devices on a chip may be results from uneven temperature or temperature gradients across the wafer during processing. Similarly, by providing identifications even on the quadrant level allows rejection of one quarter of the dice on a wafer instead of all of the dice on a wafer if a fixed percentage of dice fail qualifying test or malfunction.

Heretofore no viable method has been provided to achieve wafer location identifying indicia on the chip.

SUMMARY OF THE INVENTION

An object of the present invention is to provide an easy, reliable method of providing location identification of the die on a wafer.

Another object is to provide a method of manufacturing a mask which can readily provide location identifying indicia on each die on a wafer.

An even further object is to provide a method of making a mask using existing mask making equipment which has the capability of providing a serialization of dice on a wafer.

These and other objects of the invention are attained by forming a mask on a mask making machine using first a chip pattern reticle with a blank area thereon to form a plurality of patterns of dice on a wafer in rows and columns by operating the machine in the step and repeat mode. Next, the individual location identifying indicia are formed in the blank area of each chip by operating the mask making machine in the pattern generation mode and stepping to each blank area of each chip to provide individual location identifying indicia. The chip pattern reticle is made prior to forming the wafer mask in the step and repeat mode and a program is prepared to provide the plurality of distinctive indicia and the location of each blank of each chip location for the pattern generation. The indicia could indicate quadrants of the wafer or distinct indication of row and column for each chip.

Other objects, advantages and novel features of the present invention will become apparent from the following detailed description of the invention when considered in conjunction with the accompanying drawings.

BRIEF DESCRIPTION OF THE DRAWINGS

FIG. 1 is a topological view of a mask having a plurality of chip patterns formed thereon.

FIG. 2 is an exploded view of a chip pattern of FIG. 1.

FIG. 3 is a topological view of the chip pattern of FIG. 2 after the location identifying indicia forming step.

DESCRIPTION OF THE PREFERRED EMBODIMENTS

Figure 4:
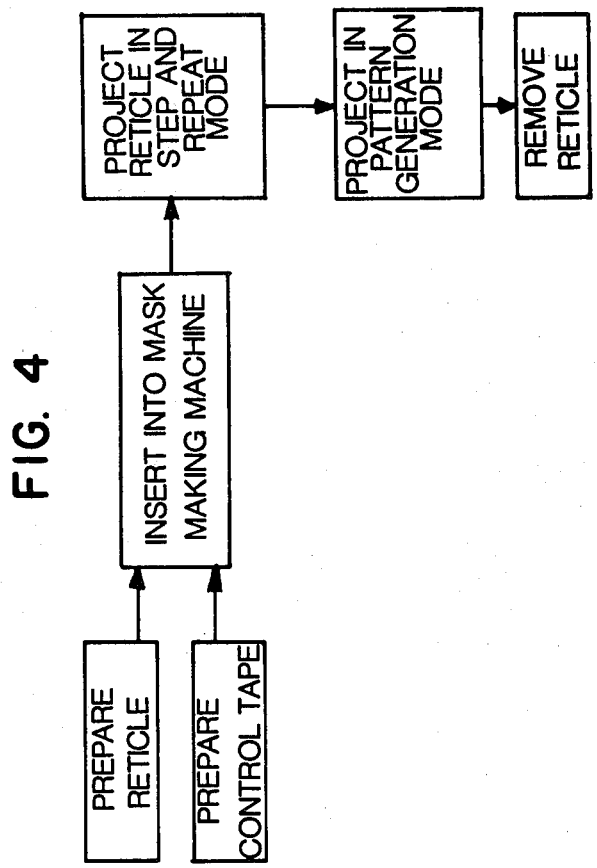
FIG. 4 is a flow diagram for methods of preparing a mask according to the present invention.

To provide location identifying indicia for each chip or die on a wafer can be accomplished by forming the distinctive indicia as part of a middle interconnect layer or other layer of a circuit. Thus, a method must be provided to modify the middle interconnect mask or other mask to accomplish the desired results of including location identifying indicia. By comparing the location identifying indicia on a specific die or chip with a template, the exact location of the die position on the wafer can be determined within plus or minus one die dimension in each direction, which is the normal overlap of a mask over a wafer.

The present invention constitutes the method of providing an easy, reliable manner to include distinctive location identifying indicia for each chip or die on a wafer. The method is carried out by positioning a mask master in a mask or reticle printing machine which is capable of operating in a pattern generation or in the step and repeat mode. Such a machine is for example an Electromask Model 2500 "Criss-Cross" machine. It should be noted that in the industry, reticle making machines are machines that make a pattern for a chip or die at some magnification. The reticle may be formed by the printing machine in the pattern generation or a step and repeat mode. This reticle is then used in a mask making machine wherein the reticle is used in a step and repeat mode only to provide a pattern without magnification. Thus, in the industry, a reticle making machine has the pattern generation and the step and repeat modes whereas a mask making machine may refer generally only to a machine having a step and repeat mode. In the present application, the mask making machine will be considered a generic device capable of making reticles or masks. For the performance of the method of the present invention, the mask making machine must have the step and repeat mode as well as pattern generation mode capability.

The first step of the present process is to prepare a reticle for the particular mask or mask level which will contain the location identifying indicia. For example, the reticle would include a pattern of a metal interconnect layer for an integrated circuit, chip or die. The reticle includes the interconnect pattern and will include a blank area into which the location identification indicia is to be formed. The next step of the present invention is to prepare a control tape which will direct the mask making machine in the pattern generation mode for the formation of individual location identifying indicia on each chip or dice in the blank area of the wafer. The control tape may either be prepared by software, using a digital computer, or by computer aided graphics.

Once the reticle and control tape have been prepared, the reticle would then be inserted in the step and repeat head of the mask making machine. The mask master which has been inserted into the machine would then be controlled by an appropriate program to be positioned under the step and repeat head. The machine would then position the reticle relative to the mask master to project the reticle onto the mask master and step and repeat it to form a plurality of reticle patterns in rows and columns on the mask master. The resulting structure is illustrated in FIG. 1 as including a mask master 10 having a plurality of die patterns 12 formed thereon.

As illustrated in the enlarged view of FIG. 2, the die pattern encompassed by the dotted line 12 includes metal interconnect patterns 14 formed interior the dotted line 12 except for a blank area set off by the dotted line 16. The portion encompassed by dotted line 16 is the position into which the location identifying indicia will be formed.

Without removing or disturbing the mask master 10, the mask making machine is switched to the pattern generation mode and run by the pattern generation tape to flash location identifying indicia in the areas 16 of each of the individual die or chip areas 12. In the pattern generation mode, the pattern generation head can be directly positioned to each area 16 on each chip individually and therefore provide, if desired, individual and distinct indicia for each chip. As illustrated in FIG. 3, the location identifying indicia 18 are the letters C and R, representing column and row. Depending upon the size of the chip, the identifying indicia may include four or six digit members, half of which would represent columns, and the other half to represent rows. Thus, the pattern generation control tape must provide not only the location of the individual areas 16 on the total mask master 10, but must also contain the desired indicia to be provided at each location.

Although the location identifying indicia 18 has been discussed as representing columns and rows, it is obvious that other types of identifying indicia may be included. As discussed previously, the indicia may represent the quadrant of the wafer in which the chip or die is located. Similarly, the chips may be consecutively numbered not representing any row or column type of array. The present method may not be performed on two separate machines, namely one having step and repeat capabilities and one having a pattern generation capability. The mask master must be inserted in a single machine and not removed between the two separate operations otherwise alignment will be lost between the chip pattern formation and the location identifying indicia formation.

From the preceding description of the preferred embodiment, it is evident that the objects of the invention are attained in that a method is provided which readily provides distinctive location identifying indicia on the dice on a wafer. Although the invention has been described and illustrated in detail, it is to be clearly understood that the same is by way of illustration and example only and is not to be taken by way of limitation. The spirit and scope of this invention are to be limited only by the terms of the appended claims.

What is claimed:
1. A method of preparing a mask for serialization of chips on a wafer comprising:
   initially forming a plurality of identical chip patterns on a mask by stepping and repeating a single chip pattern onto said mask in rows and columns, said single chip pattern having a blank area in said pattern; and
   secondly forming location identifying indicia in the resulting blank areas of each chip pattern on the mask by stepping to each blank area after the formation of said chip patterns.
2. The method according to claim 1 including the step of forming a reticle of the chip pattern and using said reticle in a mask making machine in a step and repeat mode to form said plurality of chip patterns.
3. The method according to claim 2 wherein said location identifying indicia is formed by controlling said mask making machine in a pattern generation mode to produce a plurality of distinctive indicia as the machine steps to each blank area at each location.
4. The method according to claim 3 including forming a pattern generation control tape for the plurality of indicia.
5. The method according to claim 1 wherein said location identifying indicia is identical for all the chips in a given quadrant of the wafer.
6. The method according to claim 1 wherein said location identifying indicia is distinctive for each chip indicating row and column.
7. The method according to claim 1 wherein said location identifying indicia is formed by controlling a mask making machine in a pattern generation mode to produce a plurality of distinctive indicia as the machine steps to each blank area of each chip location.
8. A method of preparing a mask for serialization of chips on a wafer comprising:
   inserting a mask master into a mask making machine capable of both step and repeat and pattern generation modes of operation sequentially;
   initially controlling said machine in a step and repeat mode to form a plurality of identical chip patterns on said mask by stepping and repeating a chip reticle, having a blank area, in rows and columns; and
   secondly controlling said machine in a pattern generation mode to form location identifying indicia in the blank area of the mask for each chip formed from said chip reticle by stepping to each blank area.

* * * * *